United States Patent [19]
Dufort et al.

[11] 4,116,749
[45] Sep. 26, 1978

[54] APPARATUS FOR THE APPLICATION OF POLYMER FILMS ON A SUPPORT

[75] Inventors: Jacques L. Dufort, Fleury-les-Aubrais; Roger R. Hermelin, Olivet, both of France

[73] Assignee: Bureau de Recherches Geologiques et Minieres, Paris, France

[21] Appl. No.: 753,381

[22] Filed: Dec. 22, 1976

[30] Foreign Application Priority Data

Dec. 24, 1975 [FR] France .............................. 75 39775

[51] Int. Cl.² .......................... B31F 5/00; B30B 15/34; B21B 27/06
[52] U.S. Cl. ................................ 156/555; 156/583; 219/469; 242/75.4; 339/5 L
[58] Field of Search .............. 156/582, 583, 555; 242/75.4; 219/469, 470, 471, 244, 155; 339/5 L, 8 L

[56] References Cited

U.S. PATENT DOCUMENTS

| | | | |
|---|---|---|---|
| 1,669,653 | 5/1928 | Campbell | 339/5 L |
| 2,232,966 | 2/1941 | Peterson | 242/75.4 |
| 2,277,134 | 3/1942 | Nelson | 242/156 |
| 3,257,939 | 6/1966 | McDermott | 219/469 |
| 3,737,359 | 6/1973 | Levitan | 156/555 |

*Primary Examiner*—Douglas J. Drummond
*Attorney, Agent, or Firm*—Sughrue, Rothwell, Mion, Zinn and Macpeak

[57] ABSTRACT

In the apparatus for applying a polymer film to a support as the film and support pass between a heating roller and a pressure roller the heating roller is provided with a freely movable electrical contact comprised of a disk extending into a pool of mercury at one end of the heating roller to accommodate longitudinal heat expansion of the roller to prevent radial variations in the heating element with consequent variations in heating patterns. The supply reel for the polymer film is provided with a spring bias friction brake having a readily disconnectable coupling with the supply reel to facilitate reel changing.

1 Claim, 4 Drawing Figures

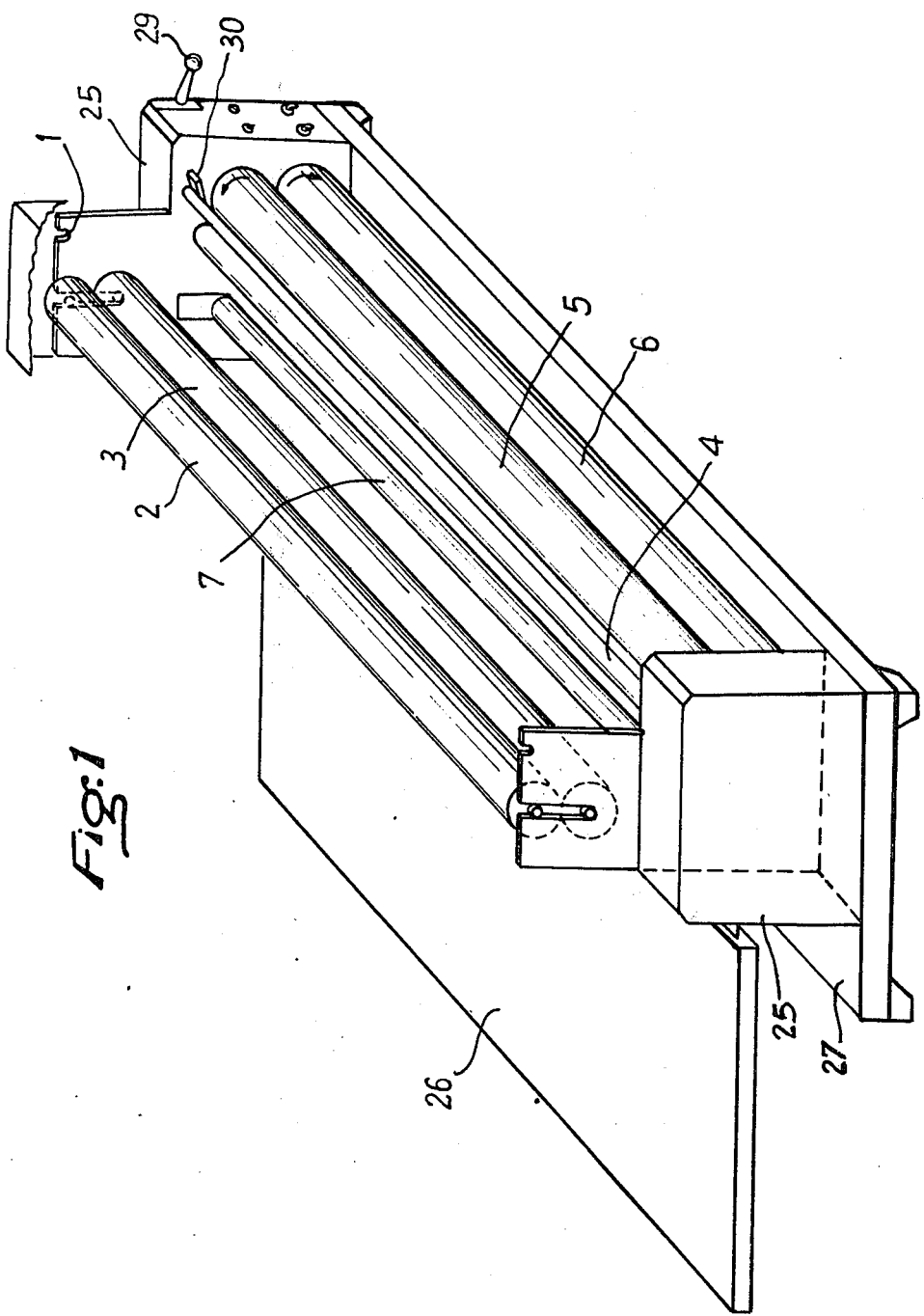

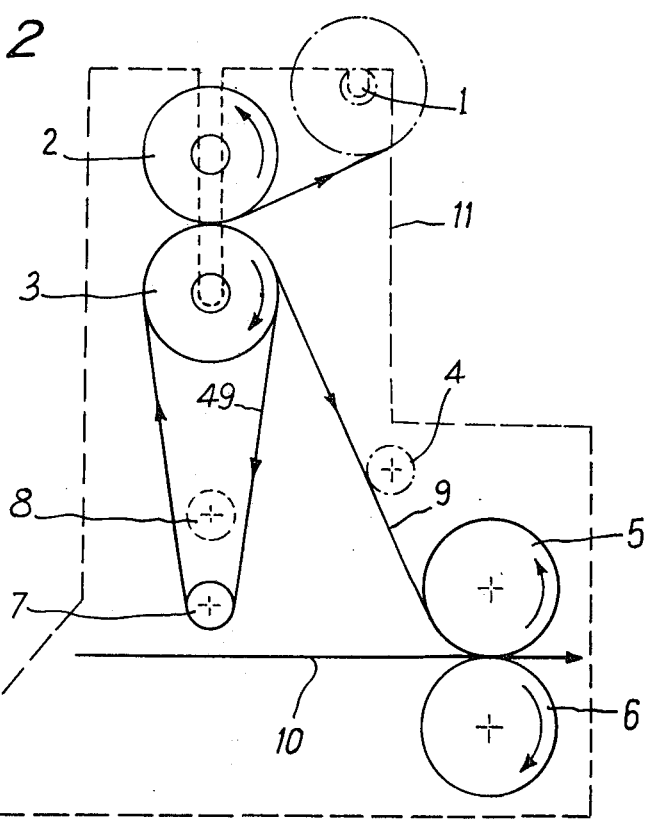
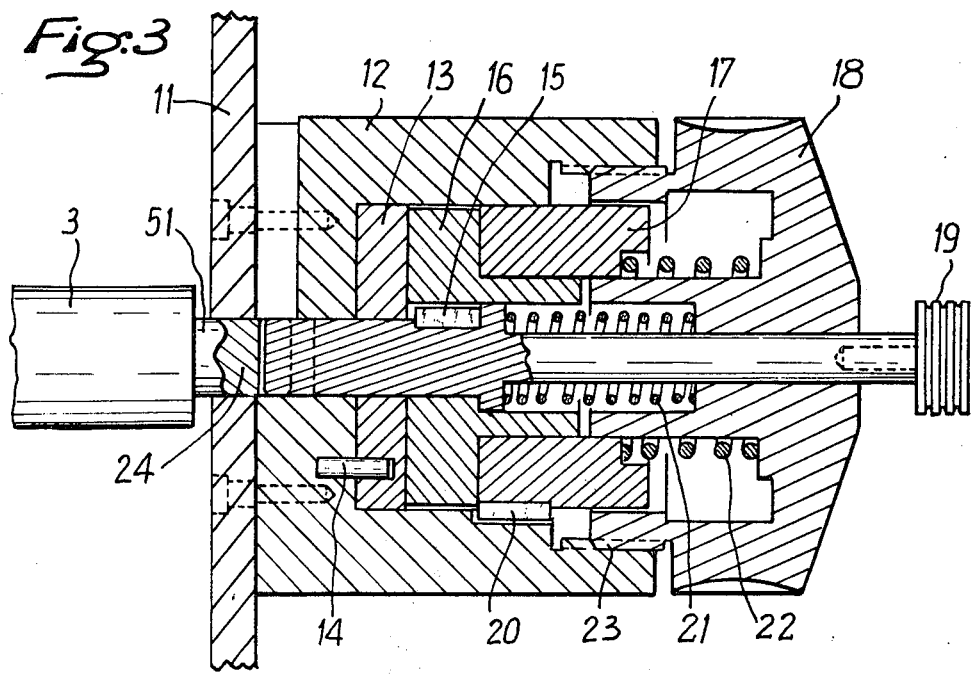

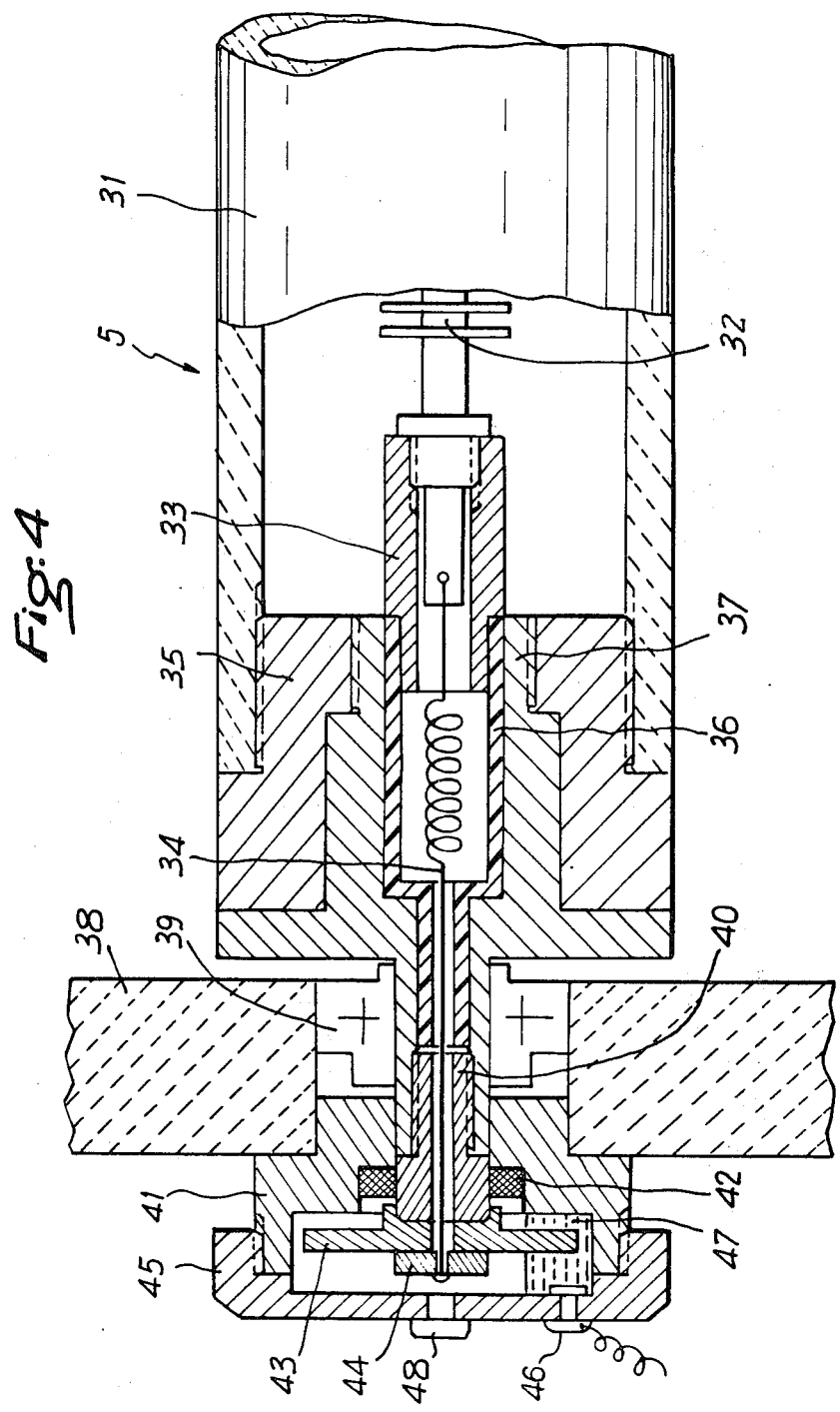

APPARATUS FOR THE APPLICATION OF POLYMER FILMS ON A SUPPORT

BACKGROUND OF THE INVENTION

1. Field of the Invention

The present invention relates to an improvement in laminating apparatus for the transfer of a photo-hardenable film onto a support for a polychromatic reproduction and particularly in a size suitable for cartography.

2. Prior Art

The usual laminating apparatus, known for example as laminators, have the drawback of not being able to provide satisfactory proofs on paper when the dimensions in width exceed a value of the order of 630 mm.

It would be possible to conceive increasing the quality of such apparatus by simple adjustments of the heating circuits of the laminating roller or the pressure of the rollers whose dimensions would be increased when using papers with larger dimensions. However, experience shows that even with such adjustments the resulting quality of the film laminated on the paper does not make it possible to make good overprints and that a layer can show a major application defect which can harm the continuity of operation, expecially in the case of a considerable number of colors, which makes it necessary to recommence the applications performed a second time without guaranteeing success. Thus, improvement of the pressure adjustment or simple regulation of the heating circuits of the laminating roller serving for the transfer of the film onto the paper do not solve the difficulties of application and consequently do not provide an increase in the reliability of the reproduction.

SUMMARY OF THE INVENTION

The object of the present invention is to provide an applicator of polymer films for photochromatic photoengraving even without the use of a screen, the applicator comprising at least a heating roller, a pressure roller for pressing the film against the support on which it is applied and a film reel, characterized in that the heating roller comprises a device for eliminating the effects of the expansion of the heating resistance of the heating roller and in that the reel comprises a device for regulating the braking of the roller.

Thus, contrary to former apparatus, it becomes possible, not only to considerably increase the width of the transferred films and support used, but also to reproduce cartographic plates, regardless of the number of colors, the reproduction being able to be made even without use of a screen.

Another object of the invention is to provide a device for regulating the braking of the film reel driven by the heating roller and counterpressure roller, characterized in that the regulation of the braking is performed by regulation of the friction force of a brake assembly at one end of the reel comprised of two bodies, of an alloy known on the market as Celeron, and a bronze brake disk. The two bodies are located on opposite sides of the disk and are connected to the frame. Further, there is provided a means for disengaging the brake assembly thus facilitating changing of the film rollers.

Another object of the invention is to provide a device for the elimination of the effects of expansion of the heating resistance of the laminating roller, characterized in that the device comprises a resistance connected to a power source by a conductive part freely moving under the action of the longitudinal expansion of the resistance. Thus there is avoided any non-homogeneous deformation of the resistance which would increase the danger of altering even very slightly the quality of the alminated film. Another object of the invention is to provide a device of this type in which the conductive part turns with the heating roller.

Therefore the width of the reproduction support is not limited and it suffices to provide axial resistance characteristics of homogeneous radiation over its entire length which can easily and homogeneously be adjusted as a function of the characteristics of the laminated film and its driving speed. The constancy of application of the layer is assured by the regulation of the braking of the reel. Thus, it becomes possible to use paper, cardboard, woods or metals for the support of the laminated film.

Other objects and characteristics of the invention will be brought out from the following description with reference to the accompanying drawings which show, by way of non-limiting example, an embodiment of the present invention.

BRIEF DESCRIPTION OF THE DRAWINGS

FIG. 1 is a general view in perspective of the applicator apparatus.

FIG. 2 is a schematic view of the unwinding and separation of the film from its protective layer.

FIG. 3 is a view in partial axial section of the braking means for the rollers.

FIG. 4 is a view in partial section with a portion of the heating roller broken away.

DETAILED DESCRIPTION OF THE INVENTION

The applicator apparatus, shown essentially in FIGS. 1 and 2 is comprised of a driving heating roller 5, a pressure roller 6 upon which rests the support 10 of paper or the like, and a reel 3. Heating roller 5 is driven by a motor, not shown, located in case 25 resting on frame 27. Pressure roller 6 is coated with a heat-resistant elastomer, such as Neoprene. The hardness and thickness of the coating are chosen as a function of the possibility of crushing under pressure, to achieve a better application of the film to any support — thin, thick, flexible or rigid — the thickness being able to amount to 10 mm. The film 9 which is unwound from reel 3 is applied to support 10 as it passes between rollers 5 and 6.

Experience has actually shown that, if the rigidity of roller 6 is taken into account, it is necessary to eliminate any bend of this roller and consequently to increase the rigidity of the roller's core. Further, the adjustable device for braking the reel 3 permits application of the polymer film 9 to any support such as wood which is previously surface treated, cardboard, agglomerates, plastics, etc.

To facilitate the change of one type of support for another, heating roller 5 is adjustable in height. The height regulating device can be any type and is not shown since it is not a part of the invention. Also roller 5 could be at a fixed height and the lower counter-roller could be adjustable in height to be able to provide the adjustable rolling stand.

Control box 25' is provided with suitable means operable under the control of handle 29 for controlling the pressure of roller 5 and a thermostat 30 provides for temperature control of roller 5. These various elements can be any known type and are not described in detail since they are not part of the invention.

Commercial photopolymer films such as Mylar being applied to a support are protected by a propylene film 49. As the films 9 and 49 are unwound from reel 4 at the same time the protective film 49 is removed and passes over separation rod 7. For convenience, this rod 7 can be moved to the dash line portion 8 when the film is changed. Also, receiving roller 2 on which protective film is changed. Also, receiving roller 2 on which protective film 49 is wound can occupy either the position shown by the solid lines during operation or the position shown by the dotted lines, the shaft of the roller being placed in notches 1 of Flanges 11 during loading of the apparatus.

The braking regulating device of roller 3, as shown in FIG. 3, is comprised of a bronze disk 16 provided with a coupling device consisting of pull knob 19 slidably connected to disk 16 by key 15 a brake ring 17 and a washer 13. The washer 13 is connected to brake body 12 by pin 14 and the brake body 12 is fastened by suitable means to flange 11. Brake ring 17, of the same material as washer 13 and known on the market as Celoron, is slidably connected to brake body 12 by key 20. In the embodiment shown by way of example, disk 16 is provided with an axial cylindrical part acting as support for ring 17. A regulating wheel 18 is threaded at 23 to brake body 12 for compressing a pressure spring 22 for biasing ring 17 against disk 16 which in turn bears on brake washer 13.

Engaging of the brake device is performed by a simple rotation of the pull knob 19 until the opposite end 24 having a flattened shape, falls into a corresponding recess of shaft 51 integral with roller 3. Interlocking is performed under the action of coupling spring 21. Disengagement is performed likewise by a simple pulling and rotating of device 19. Therefore, it suffices to adapt the tension of the film to the width of the latter by adjusting the braking force to assure a perfect application of the film. The braking force should increase with the width. The heating roller further comprises a device for compensating the expansion of the heating resistance, such as for example that shown in FIG. 4. Regulation of the tension of the film is all the more useful as the film is wound on its roller in a more or less tight manner.

Resistance 32 is made up of a cylindrical body on the same shaft as roller 5 and is provided with radial fins set close together so that the effect of axial expansion has a practically zero effect on the distance between resistance 32 and metal cylinder 31 of the roller, so that this expansion can occur without stress. Consequently, the temperature of cylinder 31 can be easily controlled by the simple control of the supply of power to resistance 32 with the aid of thermostat 30, whereas the devices for controlling of heating circuits were ineffective in previous devices. Actually, since these previous devices did not comprise any device for compensating for the axial expansion of the resistance, the resistance was subjected to stresses involving deformations disturbing the temperature field in a significant manner. According to the present invention, cylinder 31 has a good heat conductivity and is preferably of duraluminum which exhibits a mechanical resistance suited to laminating. Expansion of cylinder 31 can be performed freely permitting support 37 which is separated from cylinder 31 by an insulating part 35 to move longitudinally with bearing 39. The bearing 39 further permits driving of roller 5 by a motor, not shown, located preferably at the opposite end of roller 5 as viewed in FIG. 4.

To assure electrical connection of resistance 32 at one end thereof the resistance is supported by a brass support 33 in the shape of a sleeve serving for housing the connection of wire 34 extending through insulating pipe 36. Pipe 36 is extended by a nylon ring 40 whose end is surrounded by a sealing ring 42 which prevents contact between mercury 47 and support 37 of roller 5. The mercury is contained in a reservoir made up of a tank 41 fixed to the frame 38 and cap 45. Ring 40 carries at its end a conductive disk 43 extending into the bath of mercury 47 and assuring an electrical connection with wire 34 by fastening contact 44. The bath of mercury 47 has voltage applied to it through supply terminal 46. In the example shown, a plug 48 closes the refill orifice of reservoir 41. Thus, regardless of the expansion of resistance 32 and cylinder 31, no harmful effects will result since conductive disk 43 is able to move axially in the bath of mercury 47, which makes it possible to avoid any sort of deformation of the heating element and consequently any non-homogeneous elevation of the temperature of cylinder 31.

Although only the single embodiment of the characteristic parts of the apparatus for applying films for polychromatic photoengraving has been described, it will be understood that numerous modifications can be made in the details of the units represented.

What is claimed is:

1. An apparatus for applying a polymer film onto a support as the film and support move between a heating roller and a pressure roller journalled for rotation in a supporting frame, said heating roller comprising a hollow elongated cylinder, a heating element extending coaxially within said cylinder in uniform spaced relation relative to the interior of said hollow cylinder, support means for supporting one end of said heating element in said hollow cylinder and for rotatably supporting said cylinder in said supporting frame to allow for axial thermal expansion and contracting of said heating element and cylinder, first electrical contact means comprising a disc coaxially connected to said cylinder for axial movement therewith and a second electrical contact means comprised of a mercury bath means into which said disc extends secured to said supporting frame and adapted to be connected to a source of electrical power, said first and second contact means being disposed in movable contact with each other for relative movement in the axial direction of said heating roller without breaking contact.

* * * * *